United States Patent
Li et al.

(10) Patent No.: US 7,477,491 B2
(45) Date of Patent: Jan. 13, 2009

(54) GMR DEVICE HAVING AN IMPROVED FREE LAYER

(75) Inventors: Min Li, Fremont, CA (US); Kunliang Zhang, Fremont, CA (US); Masashi Sano, Nagano (JP); Koichi Terunuma, Nagano (JP); Simon Liao, Fremont, CA (US); Kochan Ju, Monte Sereno, CA (US)

(73) Assignee: Headway Technologies, Inc., Milpitas, CA (US)

( * ) Notice: Subject to any disclaimer, the term of this patent is extended or adjusted under 35 U.S.C. 154(b) by 376 days.

(21) Appl. No.: 11/268,076

(22) Filed: Nov. 7, 2005

(65) Prior Publication Data

US 2006/0061919 A1 Mar. 23, 2006

Related U.S. Application Data

(62) Division of application No. 10/388,289, filed on Mar. 12, 2003, now Pat. No. 6,998,150.

(51) Int. Cl.
*G11B 5/33* (2006.01)
*G11B 5/127* (2006.01)

(52) U.S. Cl. ............... 360/324.12; 360/324.1; 360/324.11

(58) Field of Classification Search .......... 360/324.1, 360/324.11, 324.12; 427/130
See application file for complete search history.

(56) References Cited

U.S. PATENT DOCUMENTS

| | | | |
|---|---|---|---|
| 5,627,704 A | 5/1997 | Lederman et al. | 360/113 |
| 5,668,688 A | 9/1997 | Dykes et al. | 360/113 |
| 6,118,624 A | 9/2000 | Fukuzawa et al. | 360/113 |
| 6,652,906 B1 * | 11/2003 | Pinarbasi | 427/130 |
| 6,709,767 B2 * | 3/2004 | Lin et al. | 428/814 |
| 6,731,477 B2 * | 5/2004 | Lin et al. | 360/324.1 |
| 6,747,852 B2 * | 6/2004 | Lin et al. | 360/324.12 |
| 2003/0030944 A1 * | 2/2003 | Lin et al. | 360/324.1 |

OTHER PUBLICATIONS

"The scalability of CPP-GMR heads toward over 100 Gbpsi compared with TMR heads", by M. Takagishi et al., R&D Centar, Toshiba Corp., Kawasaki, Japan, TMR 2001 Aug. 20, 2001.

* cited by examiner

*Primary Examiner*—Angel Castro
*Assistant Examiner*—Christopher R. Magee
(74) *Attorney, Agent, or Firm*—Saile Ackerman LLC; Stephen B. Ackerman

(57) ABSTRACT

It has been found that the insertion of a copper laminate within CoFe, or a CoFe/NiFe composite, leads to higher values of CPP GMR and DRA. However, this type of structure exhibits very negative magnetostriction, in the range of high $-10^{-6}$ to $-10^{-5}$. This problem has been overcome by giving the copper laminates an oxygen exposure treatment When this is done, the free layer is found to have a very low positive magnetostriction constant. Additionally, the value of the magnetostriction constant can be adjusted by varying the thickness of the free layer and/or the position and number of the oxygen treated copper laminates.

13 Claims, 2 Drawing Sheets

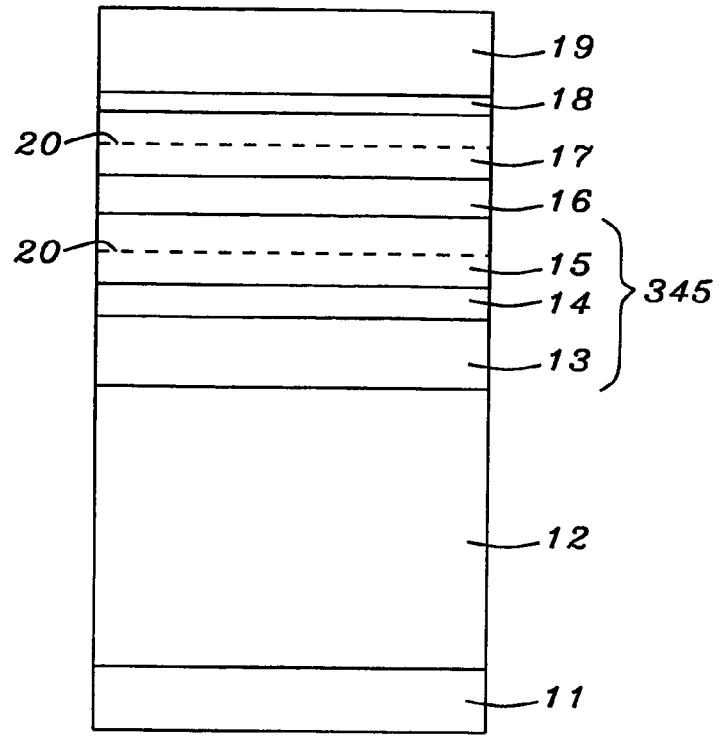
*FIG. 1 — Prior Art*
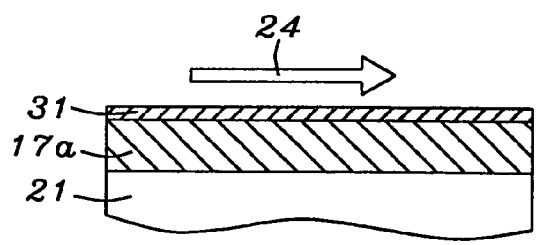
*FIG. 2a*
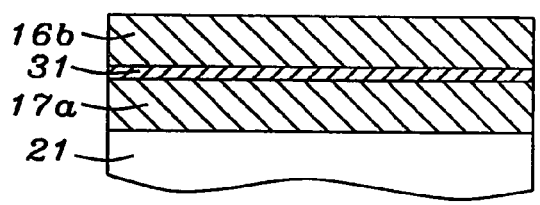
*FIG. 2b*

GMR DEVICE HAVING AN IMPROVED FREE LAYER

This is a division of patent application Ser. No. 10/388,289 filing date Mar. 12, 2003 now U.S. Pat. No. 6,998,150, Method Of Adjusting CoFe Free Layer Magnetostriction, which is herein incorporated by reference in its entirety.

FIELD OF THE INVENTION

The invention relates to the general field of CPP GMR read heads with particular reference to controlling magnetostriction in magnetically free layers of CoFe.

BACKGROUND OF THE INVENTION

The principle governing the operation of most magnetic read heads is the change of resistivity of certain materials in the presence of a magnetic field (magneto-resistance or MR). Magneto-resistance can be significantly increased by means of a structure known as a spin valve where the resistance increase (known as Giant Magneto-Resistance or GMR) derives from the fact that electrons in a magnetized solid are subject to significantly less scattering by the lattice when their own magnetization vectors (due to spin) are parallel (as opposed to anti-parallel) to the direction of magnetization of their environment.

The key elements of a spin valve are illustrated in FIG. 1. They are seed layer 11 on which is antiferromagnetic layer 12 whose purpose is to act as a pinning layer for magnetically pinned layer 345. The latter is a synthetic antiferromagnet formed by sandwiching antiferromagnetic coupling layer 14 between two antiparallel ferromagnetic layers 13 (AP2) and 15 (AP1). Next is a copper spacer layer 16 on which is low coercivity (free) ferromagnetic layer 17. A contacting layer 18 lies atop free layer 17 and cap layer 19 is present over layer 18 to protect the structure during processing.

When free layer 17 is exposed to an external magnetic field, the direction of its magnetization is free to rotate according to the direction of the external field. After the external field is removed, the magnetization of the free layer will stay at a direction, which is dictated by the minimum energy state, determined by the crystalline and shape anisotropy, current field, coupling field and demagnetization field. If the direction of the pinned field is parallel to the free layer, electrons passing between the free and pinned layers suffer less scattering. Thus, the resistance in this state is lower. If, however, the magnetization of the pinned layer is anti-parallel to that of the free layer, electrons moving from one layer into the other will suffer more scattering so the resistance of the structure will increase. The change in resistance of a spin valve is typically 8-20%.

Most GMR devices have been designed so as to measure the resistance of the free layer for current flowing parallel to the film's plane. However, as the quest for ever greater densities continues, devices that measure current flowing perpendicular to the plane (CPP) have begun to emerge. For devices depending on in-plane current, the signal strength is diluted by parallel currents flowing through the other layers of the GMR stack, so these layers should have resistivities as high as possible while the resistance of the leads into and out of the device need not be particularly low. By contrast, in a CPP device, the resistivity of the leads tend to dominate and should be as low as possible.

For application of the CPP SV structure in a reader head, some developers have substituted a CoFe_Cu layer for pure CoFe in both the free layer and in AP1. CoFe_Cu is shorthand for a CoFe layer within which has been inserted a very thin laminate of pure copper (designated as 20 in FIG. 1). It has been found that the substitution of CoFe_Cu for CoFe, or a CoFe/NiFe composite, leads to higher values of CPP GMR and DRA. While this represents an important improvement in device behavior, it has been found that this type of structure exhibits very negative magnetostriction, in the range of high $-10^{-6}$ to $-10^{-5}$.

Magnetostriction is an important form of anisotropy in magnetic materials. It relates the stress in a magnetic material to an anisotropy created by that stress. The dimensionless magnetostriction constant $\lambda$ is a constant of proportionality. If $\lambda$ is positive, then application of a tensile (stretching) stress to a bar will create an easy axis in the direction of the applied stress. If a compressive stress is applied, then the direction of the easy axis created will be perpendicular to the stress direction. If the magnetostriction constant for the material is negative, then this is reversed.

The magnetostriction constant $\lambda$ is defined as follows: If a rod having a positive value of $\lambda$ is magnetized, the rod will stretch in the direction of the magnetization. The fractional increase in length defines the magnetostriction constant $\lambda$. If the material has a negative value of $\lambda$, then the material will shorten in the direction of the magnetization. The latter is an undesirable value of the magnetostriction for head operation because in actual read heads the stress is compressive. The resulting very large negative magnetostriction will generate large anisotropy along the stripe length direction which greatly reduces the heads output. For read head applications, a low positive magnetostriction is preferred.

The present invention discloses a method to adjust the free layer magnetostriction to a very low positive value.

A routine search of the prior art was performed with the following references of interest being found:

In U.S. Pat. No. 5,627,704, Lederman et al. show a GMR CPP transducer with a flux guide yoke structure but no details are given about the makeup of the stack. In U.S. Pat. No. 6,118,624, Fukuzawa et al. describe a layer of NiFe or the like between the pinned layer and the free layer and adding an oxygen layer between the NiFe and the pinned layer. Dykes et al., in U.S. Pat. No. 5,668,688, show a CCP GMR structure, but give no details about the makeup of the structure.

SUMMARY OF THE INVENTION

It has been an object of at least one embodiment of the present invention to provide a process to manufacture a CPP GMR magnetic read head.

Another object of at least one embodiment of the present invention has been that the free layer in said read head have a low positive magnetostriction constant, as well as a low coercivity.

Still another object of at least one embodiment of the present invention has been that said process be compatible with existing processes for the manufacture of CPP GMR devices.

These objects have been achieved by using an oxygen exposure treatment on the copper spacer layer and/or laminating very thin layers of copper within the free layer itself, said layers then also receiving similar oxygen treatment. When this is done, the free layer is found to have a very low positive magnetostriction constant. As a further refinement, the value of the magnetostriction constant can be adjusted by varying the thickness of the free layer and/or the position and number of the oxygen treated copper laminates. The magnetic properties and electrical resistance are not changed much by this oxygen exposure treatment.

BRIEF DESCRIPTION OF THE DRAWINGS

FIG. 1 shows a GMR stack of the prior art.

FIGS. 2a and 2b illustrate a key feature—copper layer exposure to oxygen.

DESCRIPTION OF THE PREFERRED EMBODIMENTS

Figure 3:
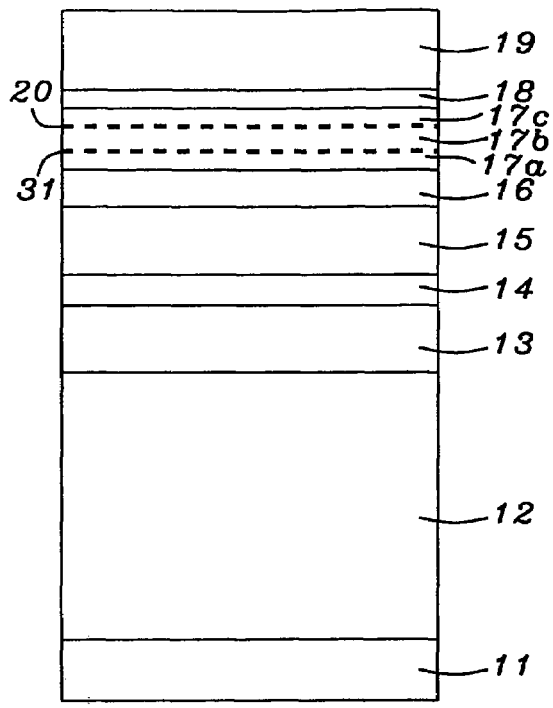
FIGS. 3-5 show the structures that result from exercising each of the embodiments of the present invention.

Since it is known that magnetostriction of bulk $Co_{90}Fe_{10}$ (henceforth referred to as CoFe) is close to zero, the large negative values seen in spin valve structures can be attributed to the nature of the underlying materials in the GMR stack. In particular, when the very thin film of CoFe attempts to conform to the underlying layer's crystal structure, it will be forced to deviate from its bulk structure. As the strain of the CoFe layer changes so does the magnetostriction. So appropriate alteration of the underneath layer structure and/or the CoFe layer structure, should make it possible to change the strain and magnetostriction of the CoFe layer. As will be described in greater detail below, exposure of the free and/or spacer layer to a small amount of oxygen has been found to alter the structure effectively.

Experimental data collected in this regard are displayed below in TABLE I which lists the thicknesses of the various sub-layers from which the spacer and free layers were formed.

| # | Spacer Structure | | | Free Layer Structure | | | | | | Properties | |
|---|---|---|---|---|---|---|---|---|---|---|---|
|   | Cu | SL | Cu | CoFe | Cu | SL | CoFe | Cu | CoFe | λ | $H_c$ |
| 1 | 10 | * | 16 | 10 | 3 | * | 10 | 3 | 10 | +3.4 | 12.1 |
| 2 | 10 | * | 16 | 13 | 3 | * | 8.5 | 3 | 8.5 | -3.4 | 12.1 |
| 3 | 10 | * | 16 | 15 | 3 | * | 7.5 | 3 | 7.5 | -10 | 12.8 |
| 4 | 26 | x | — | 10 | 3 | x | 10 | — | — | -80 | 10.9 |
| 5 | 10 | * | 16 | 10 | 3 | x | 10 | 3 | 10 | -59 | 11.5 |

λ values are $\times 10^{-7}$
$H_c$ = coercivity in Oe
all thicknesses in Angstroms
SL is an internal acronym and stands for oxygen exposure: 10 sccm for 10 sec.

Sample # 4 represents the prior art for reference. As can be seen, it showed very negative magnetostriction of $-80 \times 10^{-7}$. By adding the oxygen exposure step, the magnetostriction value was reduced to about $-60 \times 10^{-7}$ (sample 5). However this is still too large for practical applications. By adding one more oxygen exposure (inside the free layer), the value of magnetostriction changed dramatically (samples 1, 2, and 3). It was also determined that the magnetostriction depended on the thickness of the free layer. Within a thickness range of about 5 to 15 Angstroms, the thicker the free layer, the more positive the magnetostriction. This finding enabled us to adjust λ in a controllable manner from a low negative to a low positive value. In this manner the optimum structure (sample 1) was obtained.

It is important to note that, as seen in TABLE I, adding the oxygen exposure step to formation of the spacer and/or free layer did not change the free layer coercivity very much. In other words, the magnetic properties of the free layer were maintained. The sheet resistances all samples, including the reference sample 4, were almost same (not shown in the table), which indicates that the transport properties are not much altered either.

The effectiveness of the present invention is confirmed by the data presented in TABLE II below. The two structures that are A and B where A is of the prior art and B is an example of the present invention. The makeup of each was as follows:

A. Seed/IrMn/[FeCo11/Ta1]$_2$/FeCo8/Ru/[CoFe9/Cu3]$_3$ CoFe8/Cu26/[CoFe10/Cu3]$_3$/Cu7/cap B. Seed/IrMn/[FeCo11/Ta1]$_2$/FeCo8/Ru/[CoFe9/Cu3]$_3$ CoFe8/Cu10/SL/Cu16/CoFe10/Cu3/ SL[CoFe10/Cu3]$_2$/ Cu7/cap

TABLE II

| STRUCTURE | RA (ohmμm$^2$) | DRA (mohmμm$^2$) | CPP GMR (%) |
|---|---|---|---|
| A | 0.105 | 1.87 | 1.8 |
| B | 0.134 | 1.41 | 1.82 |

This confirms that the oxygen treatment can increase RA and DRA about 29% 0. This increase of DRA will enhance the sensor signal output.

The following three embodiments of the invention describe the process of the invention in greater detail, while at the same time further clarifying the structure of the present invention.

1$^{st}$ Embodiment

Figure 5:
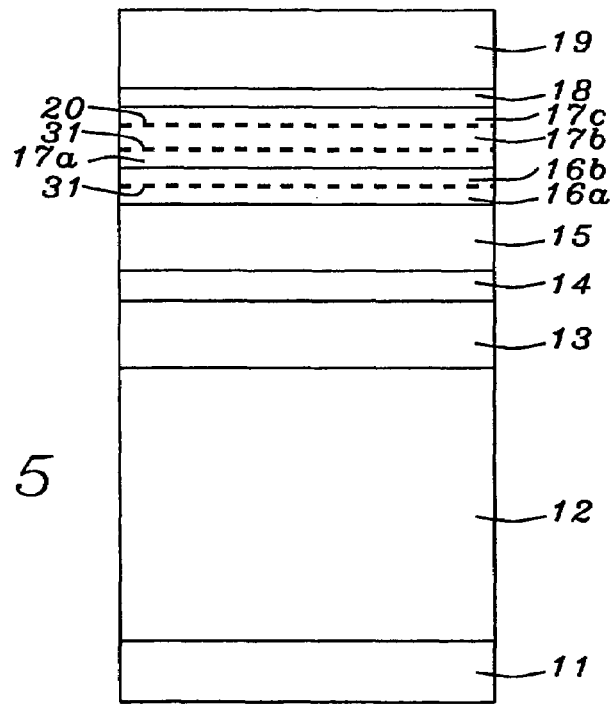

Referring now to FIG. 5, the process of the present invention begins with the provision of a substrate (not shown) on which is deposited seed layer 11. Typical materials for the latter include NiCr and Ta. The purpose of the seed layer is to provide an improved nucleating surface for antiferromagnetic layer 12 which is deposited next and which will serve as a pinning layer. Layer 12 can be MnPt, IrMn, NiMn, or similar material. The synthetic antiferromagnet, made up of layers 13, 14, and 15 (which was discussed earlier) is now deposited and becomes the pinned layer.

Following deposition of the pinned layer, in a departure from the prior art, copper sub-layer 16a is deposited to a thickness between about 5 and 20 Angstroms, less then the full thickness of the spacer. Layer 16a is then exposed to oxygen in the manner already described above so that its surface becomes equivalent to layer 31 seen earlier as part of the free layer.

This is followed by the deposition of second copper sub-layer 16b on sub-layer 31 to complete formation of the spacer layer to a total thickness between about 6 and 21 Angstroms.

Next, in another departure from prior art practice, the CoFe free layer is deposited in three stages. The first of these is sub-layer 17a which is deposited onto copper spacer layer 16 to a thickness between about 5 and 15 Angstroms. Then, copper sub-layer 31 is deposited on CoFe sub-layer 17a. The thickness of layer 31 (and other copper sub-layers that may be used later in the process) is between about 1 and 4 Angstroms.

Now follows a novel feature of the invention. Copper sub-layer 31 is exposed to oxygen. We illustrate this step in greater detail in FIG. 2a where layer 31 is seen to have been deposited onto layer 17a, with layer 21 representing the set of layers below 17a. Exposure to oxygen is symbolized by arrow 24 and represents a flow rate of oxygen over layer 31 of between about 5 and 50 SCCM, with about 10 SCCM being preferred, for between about 5 and 60 seconds, with about 10 seconds being preferred. In our apparatus, this flow rate corresponds to an oxygen pressure of about $10^{-4}$ torr.

Following the oxygen treatment of layer 31, second CoFe layer 17b is deposited on copper sub-layer 31 to a thickness between about 7.5 and 12.5 Angstroms. This is illustrated in FIG. 2b.

Returning now to FIG. 5, second copper sub-layer 20 is deposited on CoFe layer 17b, followed by the deposition thereon of third CoFe layer 17c (deposited to a thickness between about 0.5 and 7.5 Angstroms). No oxygen treatment was given to layer 20 as it s magnetostriction was already in the desired range. This completed the formation of the free layer.

Manufacture of the read head was now concluded with the deposition of contacting layer 18 followed by cap layer 19.

2$^{nd}$ Embodiment

Referring now to FIG. 3, the process for this embodiment begins with the provision of a substrate (not shown) on which is deposited seed layer 11. Typical materials for the latter include NiCr and Ta. The purpose of the seed layer is to provide an improved nucleating surface for antiferromagnetic layer 12 which is deposited next and which will serve as a pinning layer. Layer 12 can be MnPt, IrMn, NiMn, or similar material. The synthetic antiferromagnet, made up of layers 13, 14, and 15 (which was discussed earlier) is now deposited and becomes the pinned layer. This is followed by the deposition of copper spacer layer 16.

Next, in a departure from prior art practice, the CoFe free layer is deposited in three stages. The first of these is sub-layer 17a which is deposited onto copper spacer layer 16 to a thickness between about 5 and 15 Angstroms. Then, copper sub-layer 31 is deposited on CoFe sub-layer 17a. The thickness of layer 31 (and other copper sub-layers that may be used later in the process) is between about 1 and 4 Angstroms.

Now follows a novel feature of the invention. Copper sub-layer 31 is exposed to oxygen. We illustrate this step in greater detail in FIG. 2a where layer 31 is seen to have been deposited onto layer 17a, with layer 21 representing the set of layers below 17a. Exposure to oxygen is symbolized by arrow 24 and represents a flow rate of oxygen over layer 31 of between about 5 and 50 SCCM, with about 10 SCCM being preferred, for between about 5 and 60 seconds, with about 10 seconds being preferred. In our apparatus, this flow rate corresponds to an oxygen pressure of about $10^{-4}$ torr.

Following the oxygen treatment of layer 31, second CoFe layer 17b is deposited on copper sub-layer 31 to a thickness between about 7.5 and 12.5 Angstroms. This is illustrated in FIG. 2b.

Returning now to FIG. 3, second copper sub-layer 20 is deposited on CoFe layer 17b, followed by the deposition thereon of third CoFe layer 17c (deposited to a thickness between about 0.5 and 7.5 Angstroms). No oxygen treatment was given to layer 20 as it s magnetostriction was already in the desired range. This completed the formation of the free layer.

Manufacture of the read head was now concluded with the deposition of contacting layer 18 followed by cap layer 19.

3$^{rd}$ Embodiment

Figure 4:
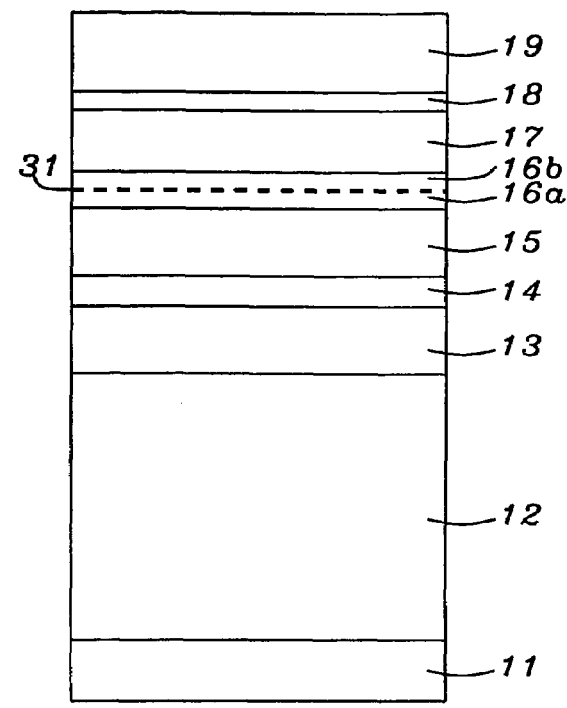

As seen in FIG. 4, this embodiment is similar to the second embodiment for all steps up to completion of the pinned layer. Formation of the spacer layer is, however, different from the prior art:

Following deposition of the pinned layer, copper sub-layer 16a is deposited to a thickness between about 5 and 20 Angstroms, less then the full thickness of the spacer. Layer 16a is then exposed to oxygen in the manner already described above so that its surface becomes equivalent to layer 31 seen earlier as part of the free layer.

This is followed by the deposition of second copper sub-layer 16b on sub-layer 31 to complete formation of the spacer layer to a total thickness between about 6 and 21 Angstroms. The remainder of the process of the second embodiment follows standard sub-processes—deposition of contacting layer 18 and cap layer 19.

What is claimed is:

1. A magnetic free layer, comprising:
   on a substrate, a first copper layer that has been exposed to oxygen;
   a second copper layer on said first copper layer;
   a first ferromagnetic sub-layer on said second copper layer;
   on said first ferromagnetic sub-layer, a third copper layer that has been exposed to oxygen;
   a second ferromagnetic sub-layer on said third copper layer;
   a fourth copper layer on said second ferromagnetic sub-layer; and
   a third ferromagnetic sub-layer on said fourth copper layer, said three ferromagnetic sub-layers and said third and fourth copper layers being the free magnetic layer.

2. The magnetic free layer described in claim 1 wherein said magnetic free layer has a thickness between about 20 and 50 Angstroms.

3. The magnetic free layer described in claim 1 wherein said second, third, and fourth copper layers have thicknesses between 6 and 21 Angstroms, between 1 and 4 Angstroms, and between 1 and 4 Angstroms, respectively.

4. The magnetic free layer described in claim 1 wherein said first and second ferromagnetic layers have thicknesses between 5 and 15 Angstroms and between 7.5 and 12.5 Angstroms, respectively.

5. The magnetic free layer described in claim 1 wherein said magnetic free layer has a positive magnetostriction constant and a coercivity that is less than about 13 Oersted.

6. A CPP GMR read head, having a free layer and a spacer layer, comprising:
   on a substrate, a seed layer, a pinning layer and a pinned layer;
   on said pinned layer, a first copper sub-layer that has been exposed to oxygen;
   a second copper sub-layer on said first copper sub-layer, said first and second copper sub-layers comprising the spacer layer;
   on said spacer layer, a first CoFe layer;
   on said first CoFe layer, a third copper sub-layer that has been exposed to oxygen;
   a second CoFe layer on said third copper sub-layer;
   a fourth copper sub-layer on said second CoFe layer;
   a third CoFe layer on said fourth copper sub-layer, whereby said third and fourth copper sub-layers and said first, second, and third CoFe layers form the free layer;
   on said free layer, a contacting layer; and
   a cap layer on said contacting layer.

7. The read head described in claim 6 wherein said spacer layer has a thickness between about 20 and 40 Angstroms.

8. The read head described in claim 6 wherein said free layer has a thickness between about 20 and 50 Angstroms.

9. The read head described in claim 6 wherein each copper sub-layer has a thickness between about 1 and 4 Angstroms.

10. The read head described in claim 6 wherein said free layer has a positive magnetostriction constant and a coercivity that is less than about 13 Oersted.

11. A CPP GMR read head, having a free layer, comprising:
   on a substrate, a seed layer, a pinning layer and a pinned layer;

on said pinned layer, a copper spacer layer;
on said copper spacer layer, a first CoFe layer;
a first copper sub-layer on said first CoFe layer, said first copper sub-layer having been exposed to oxygen;
a second CoFe layer on said first copper sub-layer;
a second copper sub-layer on said second CoFe layer;
a third CoFe layer on said second copper sub-layer, said first and second copper sub-layers and said first, second, and third CoFe layers forming the free layer;
on said free layer, a contacting layer; and
a cap layer on said contacting layer.

12. The read head described in claim 11 wherein said free layer has a thickness between about 20 and 50 Angstroms.

13. The read head described in claim 11 wherein said free layer has a positive magnetostriction constant and a coercivity that is less than about 13 Oersted.

* * * * *